United States Patent [19]

Yamaguchi et al.

[11] Patent Number: 4,902,604
[45] Date of Patent: Feb. 20, 1990

[54] PHOTOPOLYMERIZABLE COMPOSITION CONTAINING SALTS OF ORGANIC CATIONIC DYES AND ORGANIC BORON COMPOUNDS

[75] Inventors: Jun Yamaguchi, Shizuoka; Masaki Okazaki; Takanori Hioki, both of Kanagawa, all of Japan

[73] Assignee: Fuji Photo Film Co., Ltd., Kanagawa, Japan

[21] Appl. No.: 251,419

[22] Filed: Sep. 30, 1988

[30] Foreign Application Priority Data

Sep. 30, 1987 [JP] Japan ................................ 62-247479

[51] Int. Cl.$^4$ .............................................. G03C 1/68
[52] U.S. Cl. ..................................... 430/281; 430/138; 430/339; 430/341; 430/495; 430/914; 430/916; 430/927; 544/251; 544/345; 548/152; 548/217; 548/336; 548/344
[58] Field of Search ............... 430/138, 170, 281, 314, 430/339, 341, 495, 914, 916, 927; 544/251, 345; 548/152, 217, 336, 440, 465

[56] References Cited

U.S. PATENT DOCUMENTS 3,772,530  9/1988  Gottschack et al. ............... 430/281
4,772,541  9/1988  Gottschack et al. ............... 430/281
4,800,149  7/1989  Gottschack et al. ............... 430/281

*Primary Examiner*—Jack P. Brammer
*Attorney, Agent, or Firm*—Sughrue, Mion, Zinn, Macpeak & Seas

[57] ABSTRACT

Photopolymerizable initiator compositions having high photosensitivity to light sources giving visible rays and the other rays in the longer wavelengths. The compositions containing polymerizable compounds having ethylenic unsaturated bonds and salts formed by an organic boron compound anion and an organic cationic azulene dye compound comprising an azulene ring having a nitrogen atom or a chalcogen atom in the 2- or 4- position can be used for making lithographic printing plates, resinous relief printing plates, and resists or photomasks for printed circuit substrates.

The polymerizable compounds having ethylenic unsaturated bonds can be encapsulated to obtain microcapsules to be used for the formation of black-and-white or color images.

13 Claims, No Drawings

PHOTOPOLYMERIZABLE COMPOSITION CONTAINING SALTS OF ORGANIC CATIONIC DYES AND ORGANIC BORON COMPOUNDS

FIELD OF THE INVENTION

The present invention relates to a photopolymerizable composition containing a novel photopolymerization initiator and, more particularly, to a highly sensitive, spectrally sensitized photopolymerizable composition which can be used for making lithographic printing plates, resinous relief printing plates, resists or photomasks for printed circuit substrates, black-and-white or color image developing transfer sheets, or color forming sheets.

BACKGROUND OF THE INVENTION

A photopolymerizable composition basically contains a photopolymerization initiator and an addition polymerizable compound having two or more ethylenic unsaturated bonds in a molecule and changes its tackiness or its solubility in a solvent through the hardening thereof when irradiated with light. Due to these properties, it is used for many purposes, for example, photography, graphic arts, metal surface treatment, ink, and so on. The principles and examples of application thereof are widely documented. For instance, there are detailed descriptions in J. Kosar, *Light Sensitive Systems*, pp. 158–193, J Wiley & Sons, New York (1965), K. I. Jacobson & R. E. Jacobson, *Imaging Systems*, pp. 181–222, J. Wiley & Sons, New York (1976), and so on.

Recently, image forming systems utilizing light-sensitive microcapsules enclosing a photopolymerizable composition have also been proposed as one of the image forming methods to which photopolymerizable compositions are applied. For instance, methods of forming dye images, which involve imagewise exposing a color forming sheet coated with microcapsules enclosing a dye and a photopolymerizable composition comprising a vinyl compound and a photopolymerization initiator, superimposing an image receiving sheet on the color forming sheet, and then applying pressure to the whole surface of the superimposed sheets to rupture the microcapsules, whereby dye is released for transfer, are disclosed in JP-A-57-124343 (the term "JP-A" as used herein means an "unexamined published Japanese patent application"), JP-A-57-179836 and JP-A-57-197538.

In addition, attempts to extend the spectral sensitivities of those photopolymerizable compositions toward the visible region, and thereby to form digital images using a visible laser as a light source, or to apply them to a full color photosensitive material, have been made in recent years.

For example, methods of spectrally sensitizing photopolymerizable compositions for the purpose of visible laser recording are described in *Nippon Shashin Gakkaishi*, vol. 49, No. 3, p. 230 (1986) and *Kinoh Zairyo* (which means "Functional Materials"), the September issue, pp. 48–60 (1983). Further, a method of spectrally sensitizing organic peroxides, which function as polymerization initiators, with organic dyes is disclosed in JP-A-59-189340. Furthermore, organic boron anion salts of organic cationic dyes are disclosed as novel photopolymerization initiators in EP-A1-223587.

In particular, the method of using the organic boron compound anion salts of organic cationic dye compounds as light-sensitive initiators has an advantage in that the cationic dye compounds can be selected from a wide variety of dyes, and thereby it becomes feasible to design photopolymerizable compositions having sensitivities corresponding to intended wavelengths particularly in the visible region.

However, the foregoing method, although successful in giving spectral sensitivities to desired wavelengths of the visible spectrum, failed in inducing satisfactorily high sensitivity.

SUMMARY OF THE INVENTION

Therefore, a primary object of the present invention is to provide novel photopolymerizable compositions having high sensitivity as well as spectral sensitivities to light sources of wavelengths including the visible and the longer wavelength regions. More specifically, the object of the invention is to provide a composition which uses an organic boron compound anion salt of a novel organic cationic dye as a photopolymerization initiator to thereby impart high sensitivity to light sources of wavelengths including the visible and the longer wavelength regions, e.g., laser light sources, and which can be employed to advantage in producing lithographic printing plates, resinous relief printing plates, and resists or photomasks for making printed circuit substrates.

We have discovered that the above-described objects can be attained by employing a photopolymerizable composition which comprises (a) a polymerizable compound having ethylenic unsaturated bonds in a molecule and (b) a photopolymerization initiator in the form of a salt formed by an organic cationic dye compound $(D\oplus)$ and an organic boron compound anion, which salt is represented by the following formula (I):

wherein $D\oplus$ represents a cationic dye compound, and $R^1$, $R^2$, $R^3$ and $R^4$, which may be the same or different, each represents an alkyl group, an aryl group, an aralkyl group, an alkaryl group, an alkenyl group, an alkinyl group, an alicyclic group, a heterocyclic group, an allyl group, or a group having carbon atoms less than 18, selected from the derivatives of these groups, and wherein two or more of the substituent groups $R^1$ to $R^4$ may combine with each other to form a cyclic structure, with the organic cationic dye compound $(D\oplus)$ being represented by the following formula (II):

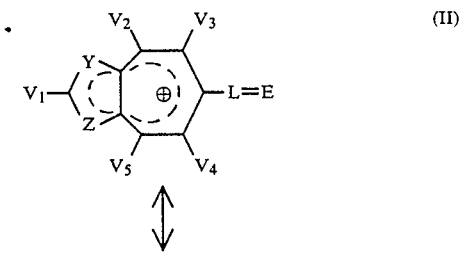

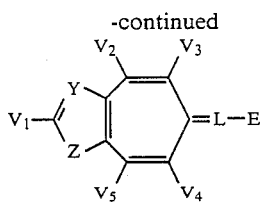

wherein E represents an auxochrome; L represents a methine group, which may be in the 4-, 5-, 6-, 7- or 8-position; $V_1$, $V_2$, $V_3$, $V_4$ and $V_5$, which may be the same or different, each represents a hydrogen atom, a halogen atom, an unsubstituted or substituted alkyl group, an acyl group, an acyloxy group, an alkoxycarbonyl group, a carbamoyl group, a sulfamoyl group, a carboxy group, a cyano group, a hydroxyl group, an amino group, an acylamino group, an alkoxy group, an alkylthio group, an alkylsulfonyl group or an aryl group, and any two of $V_2$ to $V_5$ attached to two adjacent carbon atoms may combine with each other to form a condensed ring; and Y is a carbon atom represented by the formula

wherein V has the same meaning as $V_1$ to $V_5$ or a nitrogen atom represented by $-N=$, and Z is a chalcogen atom or a nitrogen atom represented by the formula

wherein $R_{11}$ represents a hydrogen atom, a substituted or unsubstituted alkyl group, a substituted or unsubstituted aryl group, or a heterocyclic group.

DETAILED DESCRIPTION OF THE INVENTION

In the formula (II), though the position in which the methine group L is situated is typically represented by the 6-position, the methine group can also be situated in other positions (including the 4-, the 5-, the 7- and the 8-positions). Preferred bonding positions are the 4-, the 6- and the 8-positions, and especially preferred ones are the 4- and the 6-positions.

The auxochrome E in the formula (II) is described in detail below.

E can assume any of the general forms which can be found in methine dyes. typically, the auxochrome is constituted by a nitrogen or chalcogen atom, and resonates between a charged state and an uncharged state in a dye molecule. For instance, it can take any of the forms of auxochromes found in cyanine, pyrylium or thiapyrylium dyes. However, it is unnecessary to restrict the auxochrome to these forms. Other auxochromes containing, e.g., by phosphorus or boron, though less conventional, can be employed. Namely, 2-triphenylphosphoro-1,3-cyclopentadiene-5-yl is cited as examples.

In the dyes represented by the general formula (II), those represented by the following general formulae (III) to (VII) are preferred over others.

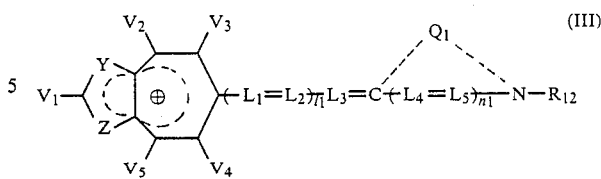

In the above formula, $V_1$ to $V_5$, Y and Z have the same meanings as in the general formula (II), respectively. In analogy wit the general formula (II), the methine bonding may be situated in any of the 4-, 5-, 6-, 7- or 8-position.

$Q_1$ represents atoms necessary to complete a 5- or 6-membered nitrogen-containing hetero ring. $L_1$, $L_2$, $L_3$, $L_4$ and $L_5$, which may be the same or different, each represents a methine group which may be substituted.

$R_{12}$ represents a substituted or unsubstituted alkyl group. $l_1$ represents an integer of from 0 to 3. $n_1$ represents 0 or 1.

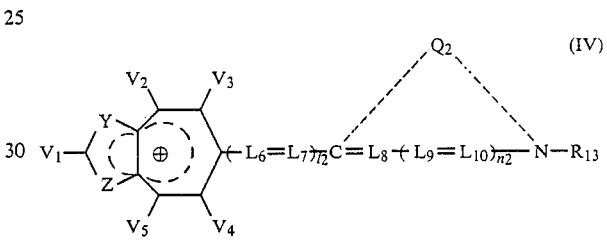

In the above formula, $V_1$ to $V_5$, Y and Z have the same meanings as in the general formula (II), respectively. In analogy with the general formula (II), the methine bonding may be situated in any of the 4-, 5-, 6-, 7- or 8-position.

$Q_2$ represents atoms necessary to complete a 5- or 6-membered nitrogen-containing hetero ring. $L_6$, $L_7$, $L_8$, $L_9$ and $L_{10}$ have the same meanings as $L_1$, $L_2$, $L_3$, $L_4$ and $L_5$, respectively.

$R_{13}$ represents a substituted or unsubstituted alkyl group. $l_2$ represents an integer of from 0 to 3. $n_2$ represents 0 or 1.

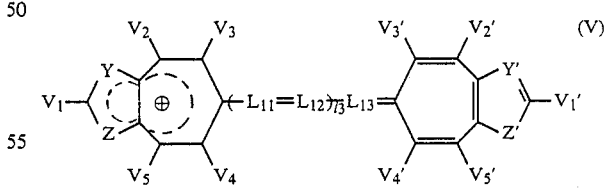

In the above formula, $V_1$ to $V_5$, Y and Z have the same meanings as those in the general formula (II), respectively. In analogy with the general formula (II), the position of the methine bonding may be any of the 4-, 5-, 6-, 7- or 8-position.

$V_1'$ to $V_5'$ have the same meanings as $V_1$ to $V_5$, respectively. $Z'$ has the same meaning as Z above.

$L_{11}$, $L_{12}$ and $L_{13}$ each have the same meaning as $L_1$, $L_2$, $L_3$, $L_4$ or $L_5$. $l_3$ represents an integer of 0 to 3.

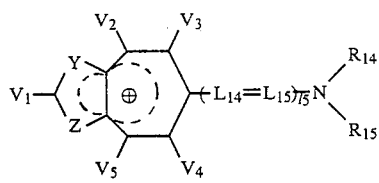 (VI)

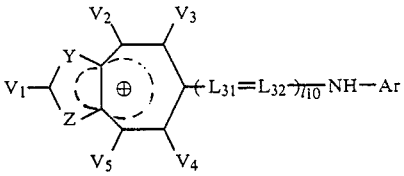 (VIII)

In the above formula, $V_1$ to $V_5$, Y and Z have the same meanings as those in the general formula (II), respectively. In analogy with the general formula (II), the position of the methine bonding may be any of the 4-, 5-, 6-, 7- or 8-position.

$R_{14}$ and $R_{15}$, which may be the same or different, each represents any of substituent group known in general tertiary amines. Also, they may combine with each other to complete a ring.

$L_{14}$ and $L_{15}$ each have the same meaning as $L_1$, $L_2$, $L_3$, $L_4$ or $L_5$. $l_5$ represents an integer of 0 to 3.

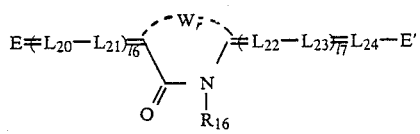 (VII)

In the above formula (VIII), E and E' are each $E_1$ or $E_2$ illustrated below, provided that at least either E or E' represents $E_1$:

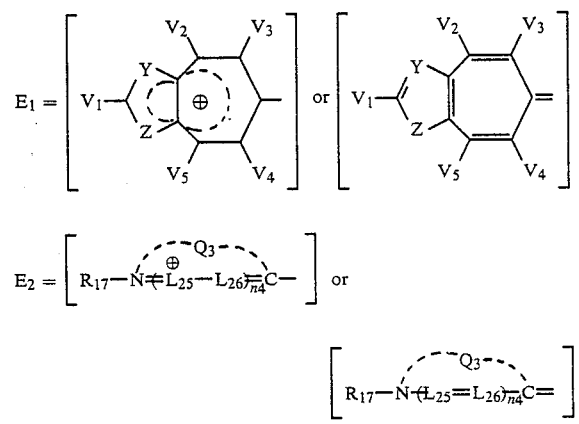

$V_1$ to $V_5$, Y and Z in $E_1$ have the same meanings as those in the general formula (II), respectively. In anology with the general formula (II), the position of the methine bonding in $E_1$ may also be any of the 4-, 5-, 6-, 7- or 8-position.

$W_1$ represents atoms necessary to complete a 5- or 6-membered hetero ring.

$R_{16}$ represents a hydrogen atom, a substituted or unsubstituted alkyl group, a substituted or unsubstituted aryl group, or a heterocyclic group.

$Q_3$ and $R_{17}$ have the same meanings as $Q_1$ and $R_{12}$ in the general formula (III), respectively.

$L_{20}$, $L_{21}$, $L_{22}$, $L_{23}$, $L_{24}$, $L_{25}$ and $L_{26}$ each have the same meaning as $L_1$, $L_2$, $L_3$, $L_4$ or $L_5$.

$l_6$ and $l_7$, which may be the same or different, each represents an integer of 0 to 3.

$n_4$ represents 0 or 1.

In the above formula (VIII), $V_1$ to $V_5$, Y and Z have the same meanings as those in the general formula (II). The position of the methine bonding, in analogy with the general formula (II), may be any of the 4-, 5-, 6- or 8-position.

$L_{31}$ and $L_{32}$ each have the same meaning as $L_1$, $L_2$, $L_3$, $L_4$ or $L_5$.

Ar represents an aromatic group.

$l_{10}$ represents an integer of from 0 to 3.

The general formulae (II) to (VIII) are illustrated in detail below.

Preferred examples of $R_{11}$ include a hydrogen atom, an unsubstituted alkyl group containing not more than 18 carbon atoms (e.g., methyl, ethyl, propyl, butyl, pentyl, octyl, decyl, dodecyl, octadecyl), a substituted alkyl group containing not more than 18 carbon atoms [such as those substituted, e.g., by a cyano group, a halogen atom (e.g., fluorine, chlorine, bromine), a hydroxyl group, an alkoxycarbonyl group containing not more than 8 carbon atoms (e.g., methoxycarbonyl, ethoxycarbonyl, phenoxycarbonyl, benzyloxycarbonyl), an alkoxy group containing not more than 8 carbon atoms (e.g., methoxy, ethoxy, benzyloxy, phenethyloxy), a monocyclic aryloxy group containing not more than 10 carbon atoms (e.g., phenoxy, p-tolyloxy), an acyloxy group containing not more than 3 carbon atoms (e.g., acetyloxy, propionyloxy), an acyl group containing not more than 8 carbon atoms (e.g., acetyl, propionyl, benzoyl, mesyl), a carbamoyl gorup (e.g., carbamoyl, N,N-dimethylcarbamoyl, morpholinocarbonyl, piperidinocarbonyl), a sulfamoyl group (e.g., sulfamoyl, N,N-dimethylsulfamoyl, morpholinosulfonyl, peperidinosulfonyl), or an aryl group containing not more than 10 carbon atoms (e.g., phenyl, 4-chlorophenyl, 4-methylphenyl, α-naphthyl)], an aryl group (e.g., phenyl, 2-naphtyl), a substituted aryl group (e.g., 3-chlorophenyl, 3-methylphenyl), and a heterocyclic group (e.g., 2-pyridyl, 2-thiazolyl).

Among these groups, unsubstituted alkyl groups (e.g., methyl, ethyl, butyl, octyl, dodecyl) are particularly preferred over oters Especially, unsubstituted alkyl groups containing 5 to 10 carbon atoms are desirable.

Preferred examples of $V_1$, $V_2$, $V_3$, $V_4$, $V_5$, $V_1'$, $V_2'$, $V_3'$, $V_4'$ and $V_5'$ each include a hydrogen atom, a halogen atom (e.g., chlorin, fluorine, bromine), an unsubstituted alkyl group conaining not more than 10 carbon atoms (e.g., methyl, ethyl), a substituted alkyl group containing not more than 18 carbon atoms (e.g., benzyl, α-naphthylmethyl, 2-phenylethyl, trifluoromethyl), an acyl group containing not more than 10 carbon atoms (e.g., acetyl, benzoyl, mesyl), an acyloxy group containing not more than 10 carbon atoms (e.g., acetyloxy), an alkoxycarbonyl group containing not more than 10 carbon atoms (e.g., methoxycarbonyl, ethoxycarbonyl, benzyloxycarbonyl), a substituted or unsubstituted carbamoyl group (e.g., carbamoyl, N,N-dimethylcarbamoyl, morpholinocarbonyl, peperidinocarbonyl), a substituted or unsubstituted sulfamoyl group (e.g., sulfamoyl, N,N-dimethylsulfamoyl, morpholinosulfonyl, peperidinosulfonyl), a carboxyl group, a cyano group, a hydroxyl group, an amino group, an acylamino group containing not more than 8 carbon atoms (e.g., acetylamino), an alkoxy group containing not more than 10 carbon atoms (e.g., methoxy, ethoxy, benzyloxy), an alkylthio group (e.g., ethylthio), an alkylsulfonyl group (e.g., methylsulfonyl), and an aryl group (e.g., phenyl, tolyl). Any two of $V_2$ to $V_5$ attached to two adjacent carbon atoms may combine with each other to form a benzene ring, or a hetero ring (e.g., pyrrole, thiophene, furan, pyridine, imidazole, triazole, thiazole).

$V_2$, $V_3$, $V_4$, $V_5$, $V_2'$, $V_3'$, $V_4'$ and $V_5'$ are each preferably a hydrogen atom. On the other hand, $V_1$ and $V_1'$ are each preferably a hydrogen atom, a chlorine atom, an alkoxy group (e.g., methoxy), an alkylthio group (e.g., methylthio), or an aryl group (e.g., phenyl).

As examples of a nucleus completed by $Q_1$ and $Q_3$ respectively, mention may be made of thiazole nuclei (e.g., thiazole, 4-methylthiazole, 4-phenylthiazole, 4,5-dimethylthiazole, dimethylthiazole, 4,5-diphenylthiazole), benzothiazole nuclei (e.g., benzothiazole, 4-chlorobenzothiazole, 5-chlorobenzothiazole, 6-chlorobenzothiazole, 5-nitrobenzothiazole, 4-methylbenzothiazole, 5-methylbenzothiazole, 6-methylbenzothiazole, 5-bromobenzothiazole, 6-bromobenzothiazole, 5-iodobenzothiazole, 5-phenylbenzothiazole, 5-methoxybenzothiazole, 6-methoxybenzothiazole, 5-ethoxybenzothiazole, 5-ethoxycarbonylbenzothiazole, 5-carboxybenzothiazole, 5-phenethylbenzothiazole, 5-fluorobenzothiazole, 5-chloro-6-methylbenzothiazole, 5,6-dimethylbenzothiazole, 5,6-dimethoxybenzothiazole, 5-hydroxy-6-methylbenzothiazole, tetrahydrobenzothiazole, 4-phnylbenzothiazole), naphthothiazole nuclei (e.g., naphtho[2,1-d]thiazole, naphtho[1,2-d]thiazole, naphtho[2,3-d]thiazole, 5-methoxynaphtho[1,2-d]thiazole, 7-ethoxynaphtho[2,1-d]thiazole, 8-methoxynaphtho[2,1d]thiazole, 5-methoxynaphtho[2,3-d]thiazole) thiazoline nuclei (e.g, thiazoline, 4-methylthiazoline, 4-nitrothiazoline), oxazole nuclei {including oxazole nuclei (e.g., oxazole, 4-methyloxazole, 4-nitrooxazole, 5-methyloxazole, 4-phenyloxazole, 4,5-diphenyloxazole, 4-ethyloxazole), benzoxazole nuclei (e.g., benzoxazole, 5-chlorobenzoxazole, 5-methylbenzoxazole, 5-bromobenzoxazole, 5-fluorobenzoxazole, 5-phenylbenzoxazole, 5-methoxybenzoxazole, 5-nitrobenzoxazole, 5-trifluoromethylbenzoxazole, 5-hydroxybenzoxazole, 6-methylbenzoxazole, 6-chlorobenzoxazole, 6-nitrobenzoxazole, 6-methoxybenzoxazole, 6-hydroxybenzoxazole, 5,6-dimethylbenzoxazole, 4,6-dimethylbenzoxazole, 5-ethoxybenzoxazole), naphthoxazole nuclei (e.g., naphtho[2,1-di]oxazole, naphtho[1,2-d]oxazole, naphtho[2,3-d]oxazole, 5-nitronaphtho[2,1-d]oxazole) and so on}, oxazoline nuclei (e.g., 4,4-dimethyloxazoline), selenazole nuclei {including salenazole nuclei (e.g., 4-methylselenazole, 4-nitroselenazole, 4-phenylselenazole), benzoselenazole nuclei (e.g., benzoselenazole, 5-chlorobenzoselenazole, 5-nitrobenzoselenazole, 5-methoxybenzoselenazole, 5-hydroxybenzoselenazole, 6-nitrobenzoselenazole, 5-chloro-6-nitrobenzoselenazole, 5,6-dimethylbenzoselenazole), naphthoselenazole nuclei (e.g., naphtho[2,1-d]selenazole, naphtho[1,2-d]selenazole), and so on}, selenazoline nuclei (e.g., selenazoline, 4-methylselenazoline), tellurazole nuclei {including tellurazole nuclei (e.g., tellurazole, 4-methyltellurazole, 4-phenyltellurazole), benzotellurazole nuclei (e.g., benzotellurazole, 5-chlorobenzotellurazole, 5-methylbenzotellurazole, 5,6-dimethylbenzotellurazole, 6-methoxybenzotellurazole), naphthotellurazole nuclei (e.g, naphtho[2,1-d]tellurazole, naphtho[1,2-d]tellurazole), and so on}, tellurazoline nuclei (e.g. tellurazoline 4-methyltellurazoline), 3,3-dialkylindolenine nuclei (e.g., 3,3-dimethylindolenine, 3,3-diethylindolenine, 3,3-dimethyl-5-cyanoindolenine, 3,3-dimethyl-6-nitroindolenine, 3,3-dimethyl-5-nitroindolenine, 3,3-dimethyl-5-methoxyindolenine, 3,3,5-trimethylindolenine, 3,3-dimethyl-5-chloroindolenine), imidazole nuclei {including imidazole nuclei (e.g., 1-alkylimidazoles, 1-alkyl-4-phenylimidazoles), benzimidazole nuclei (e.g., 1-alkylbenzimidazoles, 1-alkyl-5-chlorobenzimidazoles, 1-alkyl-5,6-dichlorobenzimidazoles, 1-alkyl-5-methoxybenzimidazoles, 1-alkyl-5-cyanobenzimidazoles, 1-alkyl-5-fluorobenzimidazoles, 1-alkyl-5-trifluoromethylbenzimidazoles, 1-alkyl-6-chloro-5-cyanobenzimidazoles, 1-alkyl-6-chloro-5-trifluoromethylbenzimidazoles, 1-allyl-5,6-dichlorobenzimidazoles, 1-allyl-5-chlorobenzimidazoles, 1-arylimidazoles, 1-arylbenzimidazoles, 1-aryl-5-chlorobenzimidazoles, 1-aryl-5,6-dichlorobenzimidazoles, 1-aryl-5-methoxybenzimidazoles, 1-aryl-5-cyanobenzimidazoles) and naphthimidazole nuclei (e g., 2-alkylnaphtho[1,2-d]imidazoles, 1-arylnaphtho[1,2-d]imidazoles), with the foregoing imidazole alkyl groups containing preferably 1 to 8 carbon atoms, such as unsubstituted alkyl groups (e.g., methyl ethyl propyl, isopropyl, butyl) and hydroxyalkyl groups (e.g., 2-hydroxyethyl, 3-hydroxypropyl), particularly preferably including methyl and ethyl groups, and with the foregoing imidazole aryl groups including a phenyl group, a halogen-substituted phenyl group (e.g., chlorophenyl), an alkyl-substituted phenyl group (e.g., methylphenyl), an alkoxy-substituted phenyl group (e.g., methoxyphenyl) and so on}, pyridine nuclei (e.g., 2-pyridine, 4-pyridine, 5-methyl-2-pyridine, 3-methyl-4-pyridine), quinoline nuclei {including quinoline nuclei (e.g., 2-quinoline, 3-methyl-2-quinoline, 5-ethyl-2-quinoline, 6-methyl-2-quinoline, 6-nitro-2-quinoline, 8-fluoro-2-quinoline, 6-methoxy-2-quinoline, 6-hydroxy-2-quinoline, 8-chloro-2-quinoline, 4-quinoline, 6-ethoxy-4-quinoline, 6-nitro-4-quinoline, 8-chloro-4-quinoline, 8-fluoro-4-quinoline, 8-methyl-4-quinoline, 8-methoxy-4-quinoline, 6-methyl-4-quinoline, 6-methoxy-4-quinoline, 6-chloro-4-quinoline), isoquinoline nuclei (e.g., 6-nitro-1-isoquinoline, 3,4-dihydro-1-isoquinoline, 6-nitro-3-isoquinoline) and so on}, imidazo[4,5-b]quinoxaline nuclei (e.g., 1,3-diethylimidazo[4,5-b]quinoxaline, 6-chloro-1,3-diallylimidazo[4,5-b]quinoxaline), oxadiazole nuclei, thiadiazole nuclei, tetrazole nuclei, pyrimidine nuclei, and so on.

$R_{12}$, $R_{13}$, and $R_{17}$ each can assume the form of a substituent of the quaternary basic nucleus of cyanine dyes.

Preferred examples of such substituent groups represented by $R_{12}$, $R_{13}$ and $R_{17}$ include unsubstituted alkyl groups containing not more than 18 carbon atoms (e.g., methyl, ethyl, propyl, butyl, pentyl, octyl, decyl, dodecyl, octadecyl), and substituted alkyl groups {preferably alkyl groups containing 1 to 18 carbon atoms inclusive of substituents, and substituted, e.g., by a cyano group, a halogen atom (such as fluorine, chlorine, bromine), a hydroxyl group, an alkoxycarbonyl group containing not more than 8 carbon atoms (such as methoxycarbonyl, ethoxycarbonyl, phenoxycarbonyl, benzyloxycarbonyl), an alkoxy group containing not more than 8 carbon atoms (such as methoxy, ethoxy, benzyloxy, phenethyloxy), a monocyclic aryloxy group containing not more than 10 carbon atoms (such as phenoxy, p-tolyloxy), an acyloxy group containing not more than 3 carbon atoms (such as acetyloxy, propionyloxy), an acyl group containing not more than 8 carbon atoms (such as acetyl, propionyl, benzoyl, mesyl), a carbamoyl group (such as carbamoyl, N,N-dimethylcarbamoyl, morpholinocarbonyl, piperidinocarbonyl), a sulfamoyl group (such as sulfamoyl, N,N-dimethylsulfamoyl, morpholinosulfonyl, piperidinosulfonyl), an aryl group containing not more than 10 carbon atoms (such as phenyl, 4-chlorophenyl, 4-methylphenyl, α-naphthyl), or so on}.

$R_{14}$ and $R_{15}$ are substituent groups of a tertiary amine used in the synthesis, so they may be any substituent of generally used tertiary amines.

More specifically, $R_{14}$ and $R_{15}$ may be the same different, and each preferably represents an unsubstituted alkyl group containing not more than 18 carbon atoms (e.g., methyl, ethyl, propyl, butyl, pentyl, octyl, decyl, dodecyl, octadecyl), a substituted alkyl group {preferably those containing not more than 18 carbon atoms inclusive of substituents and being substituted, e.g., by a cyano group, a halogen atom (such as fluorine, chlorine, bromine), a hydroxyl group, an alkoxycarbonyl group containing not more than 8 carbon atoms (such as methoxycarbonyl, ethoxycarbonyl, phenoxycarbonyl, benzyloxycarbonyl), an alkoxy group containing not more than 8 carbon atoms (such as methoxy, ethoxy, benzyloxy, phenethyloxy), a monocyclic aryl group containing not more than 10 carbon atoms (such as phenoxy, p-tolyloxy), an acyloxy group containing not more than 3 carbon atoms (such as acetyloxy, propionyloxy), an acyl group containing not more than 8 carbon atoms (such as acetyl, propionyl, benzoyl, mesyl), a carbamoyl group· (such as carbamoyl, N,N-dimethylcarbamoyl, morpholinocarboyl, piperidinocarbonyl), a sulfamoyl group (such as sulfamoyl, N,N-dimethylsulfamoyl, morpholinosulfonyl piperidinosulfonyl), an aryl group containing not more than 10 carbon atoms (such as phenyl, 4-chlorophenyl, 4-methylphenyl, α-naphthyl), or so on}, a cyano group, an alkoxy group (e.g., methoxy, ethoxy), an aryloxy group (e.g., phenoxy), or an alkoxycarbonyl group (e.g., ethoxycarbonyl).

In addition, $R_{14}$ and $R_{15}$ can combine with each other to complete a saturated or unsaturated heterocyclic ring, other than aromatic ones.

For example, pyrrolidine, piperidine, morpholine, piperazine, tetrahydropyridine, dihydropyridine and tetrahydroquinoline are preferred as the heterocyclic ring completed by $R_{14}$ and $R_{15}$.

More preferably, $R_{14}$ and $R_{15}$ are each an ethyl group.

Preferred examples of a heterocyclic nucleus completed by $Q_2$ include a pyrrole nucleus, a carbazole nucleus, an indole nucleus, a pyrazole ncleus, a pyrazolo[1,5-a]benzimidazole nucleus, a pyrazolo[1,5-b]quinazolone nucleus and an indazole nucleus.

A 5- or 6-membered heterocyclic ring completed by $W_1$ corresponds to any of those obtained by removing an oxo or thioxo group located at the suitable position from the following heterocyclic rings.

Specific examples of such heterocyclic rings include 2-pyrazoline-5-one, pyrazolidine-3,5-dione, imidazoline-5-one, hydantoin, 2- or 4-thiohydantoin, 2-iminoox-azolidine-4-one, 2-oxazoline-5-one, 2-thiooxazolidine-2,4-dione, isooxazolin-5-one, 2-thiazoline-4-one. thiazolidine-4-one, thiazoline-2,4-dione, rhodanien. thiazolidine-2,4-dithione, isorhodanine, indane-1,3-dione, thiophene-3-one, thiophene-3-one-1,1-dioxide. indoline-2-one, indoline-3-one, indazoline-3-one, 2-oxoindazolinium, 2-oxoindazolinium, 5,7-dioxo-6,7-dihydrothiazolo[3,2-a]pyrimidine, cyclohexane-1,3-dione, 3,4-dihydroisoquinoline-4-one, 1,3-dioxane-4,6-dione, barbituric acid, 2-thiobarbituric acid, chroman-2,4-dione, barbituric acid, 2-thiobarbituric acid, chroman-2,4-dione, indazoline-2-one and pyrido[1,2-a]pyrimidine-1,3-dione nuclei.

Among these nuclei, 1,3-dialkylbarbitutric acids, 1,3-dialkyl-2-thiobarbituric acids and 3-alkylthodanines (wherein the alkyl moiety is preferably an unsubstituted one) are preferred over others.

$R_{16}$, which is a substituent group attached to the nitrogen atom contained in the nucleus, is prefereably a hydrogen atom, an alkyl group containing 1 to 18, preferably 1 to 7, and particularly preferably 1 to 4, carbon atoms (e.g., methyl, ethyl propyl, isopropyl, butyl, isobutyl, hexyl, octyl, dodecyl. octadecyl), a substituted alkyl group {such as an aralkyl group (e.g., benzyl. 2-phenylethyl), a hydroxyalkyl group (e.g., 2-hydroxyethyl, 3-hydroxypropyl), an alkoxyalkyl group (e.g., 2-methoxyethyl, 2-(2-methoxyethoxy)ethyl), a ring-substituted alkyl group (e.g., 2-(pyrrolidine-2-one-1-yl)ethyl, tetrahydrofurfuryl, 2-morpholinoethyl), 2-acetoxyethyl, carbomethoxymethyl, 2-methanesulfonylaminoethyl, etc.}, an allyl group, an aryl group (e.g, phenyl, 2-naphthyl), a substituted aryl group (e.g., 4-carboxyphenyl, 4-sulfophenyl, 3-chlorophenyl, 3-methylphenyl), or a heterocyclic group (e.g., 2-pyridyl, 2-thiazolyl).

Ar represents an aromatic group, preferably an aryl group (e.g., phenyl, 3-chlorophenyl, naphthyl).

$L_1$, $L_2$, $L_3$, $L_4$, $L_5$, $L_6$, $L_7$, $L_8$, $L_9$, $L_{10}$, $L_{11}$, $L_{12}$, $L_{13}$, $L_{14}$, $L_{15}$, $L_{20}$, $L_{21}$, $L_{22}$, $L_{23}$, $L_{24}$, $L_{25}$, $L_{26}$, $L_{31}$ and $L_{32}$ are each a methine group {which may be substituted by a substituted or unsubstituted alkyl group (e.g., methyl, ethyl), a substituted or unsubstituted aryl group (e.g., phenyl), or a halogen atom (e.g., chlorine, bromine)}, or they may combine with another methine group or an auxochrome to form a ring.

Specific examples of methine dyes which can be used in the present invention are illustrated below. However, the scope of the invention should not be construed as being limited to these examples.

Examples of compounds represented by the general formula (III) are shown below by Compounds (1) to (29).

Compounds (1) to (18) have the formula

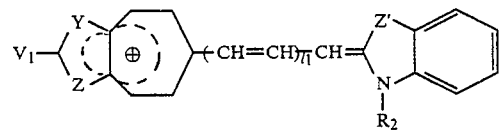

and their substituent groups are shown below.

| Compound | Y | Z | $V_1$ | Z' | $R_2$ | $l_1$ |
|---|---|---|---|---|---|---|
| (1) | N | N—CH$_3$ | H | S | C$_2$H$_5$ | 0 |
| (2) | N | N—CH$_3$ | SCH$_3$ | S | C$_2$H$_5$ | 0 |

-continued

| Compound | Y | Z | V₁ | Z' | R₂ | l₁ |
|---|---|---|---|---|---|---|
| (3) | N | N—CH₃ | Cl | S | C₂H₅ | 0 |
| (4) | N | N—CH₃ | OCH₃ | S | C₂H₅ | 0 |
| (5) | N | N—CH₃ | phenyl | S | C₂H₅ | 0 |
| (6) | N | N—C₂H₅ | SCH₃ | N—C₂H₅ | C₂H₅ | 0 |
| (7) | N | N—CH₃ | SCH₃ | O | C₂H₅ | 0 |
| (8) | N | N—CH₃ | phenyl | Se | C₂H₅ | 1 |
| (9) | N | N—CH₃ | SCH₃ | S | C₂H₅ | 1 |
| (10) | N | N—CH₃ | —H | N—CH₃ | CH₃ | 2 |
| (11) | N | N—CH₃ | OCH₃ | S | CH₃ | 3 |
| (12) | N | S | SCH₃ | O | C₂H₅ | 0 |
| (13) | N | O | H | S | CH₃ | 1 |
| (14) | N | Se | H | Se | CH₃ | 1 |
| (15) | N | N—CH₃ | —Cl | C(CH₃)₂ | CH₃ | 2 |
| (16) | CH | N—CH₃ | —Cl | S | C₂H₅ | 3 |
| (17) | CH | O | —Cl | S | C₂H₅ | 0 |
| (18) | CH | S | —Cl | O | C₂H₅ | 0 |

(19)

[Structural formula shown]

Compounds (20) to (24) have the formula

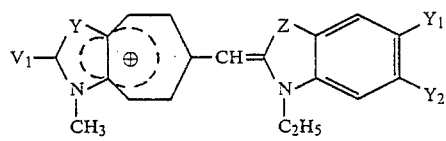

and their substituent groups are shown below.

| Compound | V₁ | Z | Y₁ | Y₂ |
|---|---|---|---|---|
| (20) | phenyl | O | OCH₃ | OCH₃ |
| (21) | SCH₃ | S | CH₃ | CH₃ |
| (22) | H | N—C₂H₅ | CH₃ | H |
| (23) | phenyl | S | NO₂ | H |
| (24) | H | S | Cl | Cl |

Compounds (b 25) and (26) have the formula

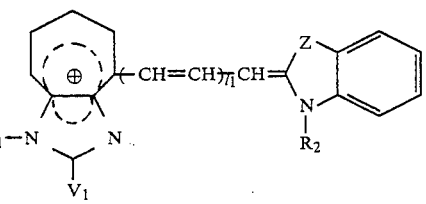

and their substituent groups are shown below.

| Compound | V₁ | R₁ | Z | R₂ | l₁ |
|---|---|---|---|---|---|
| (25) | SCH₃ | CH₃ | S | C₂H₅ | 0 |

| Compound | $V_1$ | $R_1$ | Z | $R_2$ | $l_1$ |
|---|---|---|---|---|---|
| (26) | phenyl | $CH_3$ | Se | $C_2H_5$ | 2 |
| (27) | (structure shown) | | | | |
| (28) | (structure shown) | | | | |
| (29) | (structure shown) | | | | |

Specific examples of the compounds represented by the general formula (IV) are illustrated below by Compounds (30) to (37).

Compounds (30) to (35) have the formula

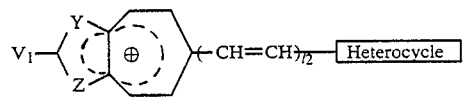

and their substituent groups are shown below.

| Compound | Y | Z | $V_1$ | $l_2$ | Heterocycle |
|---|---|---|---|---|---|
| (30) | N | $N-CH_3$ | phenyl | 1 | (indole with $N-C_2H_5$) |
| (31) | N | $N-C_2H_5$ | $SCH_3$ | 1 | (2-phenyl-N-phenyl indoline) |

-continued
| Compound | Y | Z | $V_1$ | $l_2$ | Heterocycle |
|---|---|---|---|---|---|
| (32) | N | N—CH₃ | Cl | 1 | |
| (33) | N | N—CH₃ | | 1 | |
| (34) | N | O | SCH₃ | 1 | |
| (35) | N | N—CH₃ | | 1 | |
| (36) | | | | | |
| (37) | | | | | |
Examples of compounds represented by the general formula (V) are shown below by Compounds (38) to (46).
Compounds (38) to (42) have the formuls
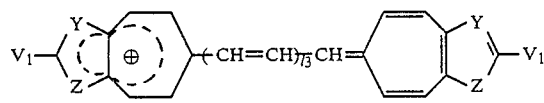
and their substituent groups are shown below.

| Compound | Y | Z | $V_1$ | $l_3$ |
|---|---|---|---|---|
| (38) | N | N—$CH_3$ | H | 0 |
| (39) | N | N—$CH_3$ | $SCH_3$ | 0 |
| (40) | N | N—$CH_3$ | $SCH_3$ | 1 |
| (41) | N | S | 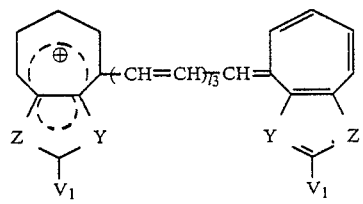 | 1 |
| (42) | N | O | $SCH_3$ | 1 |

Compounds (43) to (45) have the formula

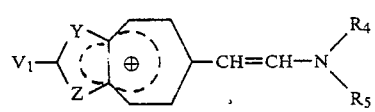

and their substituent groups are shown below.

| Compound | Y | Z | $V_1$ | $l_3$ |
|---|---|---|---|---|
| (43) | N | N—$CH_3$ | $SCH_3$ | 0 |
| (44) | N | N—$CH_3$ | $SCH_3$ | 1 |
| (45) | N | N—$CH_3$ | 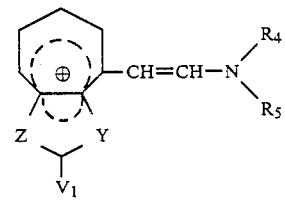 | 1 |

(46)

Examples of compounds represented by the general formula (VI) are shown below by Compounds (47) to (51).

Compounds (47) to (49) have the formula and their substituent groups are shown below.

| Compound | Y | Z | $V_1$ | $R_4$ | $R_5$ |
|---|---|---|---|---|---|
| (47) | N | N—$CH_3$ |  | $C_2H_5$ | $C_2H_5$ |
| (48) | N | N—$CH_3$ | —$SCH_3$ | $C_2H_5$ | $C_2H_5$ |
| (49) | N | N—$C_2H_5$ | H | —$(CH_2)_2O$ | $(CH_2)_2$— |

Compounds (50) and (51) have the formula and their substituent groups are shown below.

| Compound | Y | Z | $V_1$ | $R_4$ | $R_5$ |
|---|---|---|---|---|---|
| (50) | N | N—$CH_3$ | $SCH_3$ | $C_2H_5$ | $C_2H_5$ |
| (51) | N | S | $SCH_3$ | —$(CH_2)_5$— | |

Examples of compounds represented by the general formula (VII) are shown below. (Compounds (52) and (53)) (52)

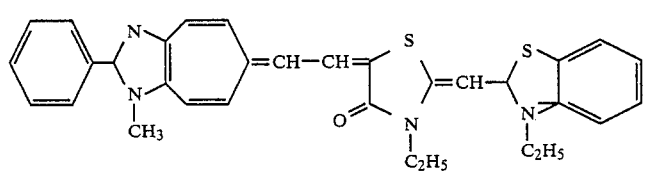

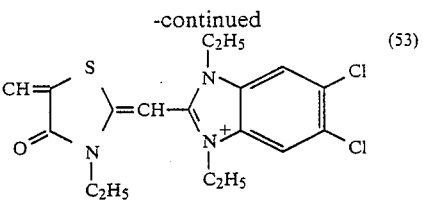

(53)

Examples of compounds represented by the general formula (VIII) are shown below. (Compounds (54) and (55))

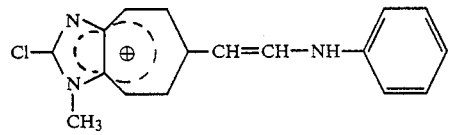

(54)

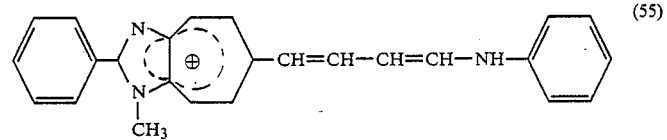

(55)

The dyes represented by the formula (II) can be synthesized by reference to JP-A-63-192039. As for the organic boron compound anion in the formula (I), many different ones can be used by reference to U.S. Pat. Nos. 3,567,453, 4,307,182, 4,343,891, 4,447,521 and 4,450,227, JP-A-62-150242, JP-A-62-143044, and so on. In the most preferred compounds, $R^1=R^2=R^3=$phenyl, p-methoxyphenyl, p-butoxyphenyl, p-dimethylaminophenyl or p-chlorophenyl, and $R^4=$methyl, ethyl, propyl, butyl, n-hexyl, n-heptyl or benzyl.

Although it goes without saying that organic boron compound anion salts of organic cation dyes prepared by reference, e.g., to the above-cited patents can be used as the boron compound of the formula (I), an arbitrary salt of an organic cationic dye, e.g., a chloride, an iodide, etc., and an arbitrary salt of an organic boron compound, such as a tetrabutylammonium salt, may be added independently to the photopolymerizable composition.

The polymerizable compound having at least one ethylenic unsaturated bond, which is an essential constituent of the composition of the present invention, is intended to include a monomer, a prepolymer such as a dimer, a trimer or another oligomer, a mixture thereof, a copolymer, or the like. As examples of such a polymerizable compound, mention may be made of unsaturated carboxylic acids, their salts, their esters of aliphatic polyhydric alcohols, their amides of aliphatic polyamine compounds, and so on.

Specific examples of unsaturated carboxylic acids include acrylic acid, methacrylic acid, itaconic acid, crotonic acid, isocrotonic acid, maleic acid, and so on.

Specific examples of salts of unsaturated carboxylic acids include sodium salts and potassium salts of the foregoing acids.

Specific examples of esters of aliphatic polyhydric alcohol compounds and unsaturated carboxylic acids include acrylic acid esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, 1,4-cyclohexane-diol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetra-acrylate, sorbitol pentaacrylate, sorbitol hexaacrylate, polyester acrylate oligomers, etc.; methacrylic acid esters such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pantaerythritol trimethacrylate, dipentaerythritol dimethacrylate, sorbitol trimethacrylate, sorbitol tetramethacrylate, bis-[p-(3-methacryloxy-2-hydroxypropoxy)phenyl]dimethylmethane, bis-[p-(acryloxyethoxy)phenyl]dimethylmethane, etc.; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.; crotonic acid esters such as ethylene glycol dicrotonate, tetramethylene glycol dicrotonate, pentaerythritol dicrotonate, sorbitol tetracrotonate, etc.; isocrotonic acid esters such as ethylene glycol diisocrotonate, pentaerythritol diisocrotonate, sorbitol tetraisocrotonate, etc.; and maleic acid esters such as ethylene glycol dimaleate, triethylene glycol dimaleate, pentaerythritol dimaleate, sorbitol tetramaleate, etc. In addition, mixtures of two or more of the above-cited esters can be used.

Specific examples of amides of aliphatic polyamines and unsaturated carboxylic acids include methylenebisacrylamide, methylenebis-methacrylamide, 1,6-hexamethylenebis-acrylamide, 1,6-hexamethylenebismethacrylamide, methacrylamide, diethylenetriamine trisacrylamide. xylylenebisacrylamide, xylylenebismethacrylamide, and the like.

As other examples of the polymerizable compounds, mention may be made of vinylurethane compounds which have two or more of polymerizable vinyl groups in a molecule and are prepared by addition of hydroxyl group-containing vinyl monomers represented by the following formula (A) to polyisocyanate compounds containing two or more of isocyanate groups in a molecule, as described in JP-B-48-41708 (The term "JP-B" as used herein means an "examined Japanese patent publication"):

$$CH_2=C(R')COOCH_2CH(R'')OH \quad (A)$$

wherein R' and R", which may be the same or different, each represents H or CH$_3$.

Also, high molecular weight compounds containing vinyl or vinylidene groups, e.g., condensates of high molecular weight compounds containing hydroxyl groups, amino groups, epoxy groups, halogen atoms or sulfonyloxy groups in their side chains and acrylic acid, methacrylic acid or derivatives thereof, can be used in the present invention.

Further, color image-forming substances, e.g., compounds prepared by introducing one or more of a vinyl group into a dye or leuco dye molecule, can be utilized as the polymerizable compound.

It is desirable that the salt formed by an organic boron compound anion and an organic cationic dye compound be added in a proportion of from about 0.01 to about 50 wt. % to the polymerizable compound.

Novel photopolymerizable compositions comprising such ethylenic unsaturated bond-containing polymerizable compounds and salts formed by an organic boron compound anion and an organic cationic dye compound as exemplified above can be used in various ways.

For instance, the photopolymerizable compositions coated on supports together with binder polymers can be applied to resist materials for making printing plates and printed circuit substrates by reference to U.S. Pat. Nos. 4,604,342, 4,587,199, 4,629,680, 4,415,652, 4,431,723 and 4,550,073, JP-A-61-285444, JP-A-61-213213 and so on, to color proof materials by reference to JP-A-62-67529, U.S. Pat. No. 4,604,340, and so on, and to many fields according to known methods.

Moreover, the photopolymerizable composition of the present invention can be used to greater advantage in producing image-forming systems utilizing microcapsules, because it has high sensitivity even in the visible region.

In applying the present composition to image-forming systems utilizing microcapsules, JP-A-57-197538, U.S. Pat. Nos. 4,587,194, 4,399,209, and 4,440,846, EP-A1-223587 and so on can be referred to. The image formation in such systems can be effected, e.g., according to a process which comprises forming a light-sensitive sheet by coating on a support microcapsules enclosing a dye precursor and a photopolymerizable composition comprising an ethylenic vinyl compound and a photopolymerization initiator, subjecting the light-sensitive sheet to imagtewise exposure to harden the exposed microcapsules, and applying pressure to the whole surface of the light-sensitive sheet superposed on a color developer sheet, thereby rupturing the unexposed microcapsules and transferring the color image-forming substance (e.g., a dye precursor) into an image-receiving element (e.g., a color developer layer) to achieve color development.

Now, the present invention is illustrated citing the image-forming systems utilizing microcapsules as an example.

To the photopolymerizable composition of the present invention, various kinds of additives can be added depending on the intended use. For example, a thermal polymerization inhibitor, a polymerization accelerator, image-forming substances (dyes, dye precursors, or pigments) and so on can be added.

Methods of producing light-sensitive materials utilizing the photopolymerizable composition of the present invention are described below.

Various methods can be employed for the production of the light-sensitive materials, and a general method comprises the steps of preparing coating compositions by dissolving, emulsifying or dispersing ingredients to constitute a light-sensitive layer into proper solvents, coating the compositions on a support, and drying the coat(s).

In general, each of the above-described coating compositions is prepared by firstly preparing each of liquid compositions containing individual ingredients, and then mixing these liquid compositions. These liquid compositions may be prepared for each ingredient, or so as to contain two or more of ingredients together. Some of the ingredients to constitute the light-sensitive layer can be added during or after the preparation of the foregoing liquid composition or coating composition. Further, as described hereinafter, a method of preparing a secondary composition by emulsifying an oily (or aqueous) composition containing one or more of an ingredient into an aqueous (or oily) solvent can be employed.

A polymerizable compound in the photopolymerizable composition of the present invention can be incorporated in a light-sensitive layer in the form of emulsion droplets, and the droplets can be enclosed with microcapsule wall. Therein, it is to be desired that the salt formed by the organic boron compound anion and the organic cationic dye compound also should be contained in the droplets.

To the composition of the present invention, a thermal polymerization inhibitor can be further added mainly for the purpose of inhibiting the thermal polymerization of the photopolymerizable composition during storage. Specific examples of the thermal polymerization inhibitor include p-methoxyphenol, hydroquinone, alkyl- or aryl-substituted hydroquinones, t-butylcatechol, pyrogallol, cuprous chloride, chloranil, naphthylamine, β-naphthol, 2,6-di-t-butyl-p-cresol, pyridine, nitrobenzene, dinitrobenzene, p-toluidine, methylene blue organocopper, methyl salicylate, and so on. These thermal polymerization inhibitors each are preferably used in an amount of from 0.001 to 5 parts by weight per 100 parts by weight of ethylenic unsaturated compound.

As a polymerization accelerator which can be further added to the composition of the present invention, a reducing agent, e.g., an oxygen scavenger or a compound that functions as a chain transfer agent of an active hydrogen donor, can be used in combination with a compound containing an -SH group in the molecule. Specific examples of oxygen scavengers which have been found to be useful include phosphines, phosphonates, phosphites, stannous salts, and other compounds which can be easily oxidized with oxygen. Useful examples of chain transfer agents include N-phenylglycine, trimethyl barbituric acid, 2-mercaptobenzoxazole, 2-mercaptobenzothiazole, N,N-dimethyl-2,6-diisopropylaniline, N,N-2,4,6-pentamethylaniline, and other compounds having hydrogen that can be easily extracted with a radical.

A color image-forming substance can be incorporated into the composition of the present invention, and thereby the polymerized part can be colored after removal of the unpolymerized part, or a color image can be formed in an image-receiving element into which the unpolymerized part is transferred.

A wide variety of color image-forming substances can be used in the present invention. For instance, dyes and pigments can be cited as materials which are colored in themselves. When these materials are used, the part (the microcapsules) in which high molecular weight polymers have not been produced is destroyed, and the materials are transferred into an image-receiving material using an appropriate means to result in the formation of color images. As for the dyes and pigments, not only commercially available ones but also other known dyes and pigments, e.g., as described in various literature [such as *Senryo Binran* (which means "handbook of dyes"), compiled by Yukigosei Kagaku Kyokai and published in 1970, and *Seishin Ganryo Binran* (which means "the newest handbook of pigments"), compiled by Nippon Ganryo Gijutsu Kyokai and published in 1977], can be utilized. These dyes and pigments are used in the form of a solution or a dispersion.

On the other hand, color image-forming colorless substances are divided into two groups. One group consists of substances which, although themselves are colorless or only lightly colored, develop their colors by the application of some energy, e.g., heat, pressure, light and so on. The other group consists of substances which, although themselves do not develop their colors by the application of any energy, develop their colors by contact with another component. As examples of substances belonging to the former group, there are known thermochromic compounds, piezochromic compounds, photochromic compound, and leuco bodies such as triarylmethane dyes, quinone dyes, indigoide dyes, azine dyes and so on. Each of these compounds develops its color by the application of heat or pressure, irradiation with light, or air oxidation.

Examples of the latter group include various kinds of systems comprising two or more components among which such a reaction as an acid-base reaction, a reduction-oxidation reaction, a coupling reaction or a chelate-forming reaction takes place to produce a color. More specifically, there can be utilized a color-producing system as is used for pressure-sensitive paper, which comprises a color former having such a partial structure as a lactone, lactam, spiropyran or the like, and an acidic substance (a color developer) such as acid clay, phenols or the like; a system utilizing the azo coupling reaction between an aromatic diazonium salt, diazotate or diazosulfonate, and naphthols, anilines, active methylenes or the like; and chelate-forming systems utilizing the reaction of hexamethylenetetraamine with ferric ion and gallic acid, the reaction between phenolphthalein-Complexon and an alkaline earth metal ion, and so on; redox reactions such as the reaction between ferric stearate and pyrogallol, the reaction of silver behenate and 4-methoxy-1-naphthol, and so on.

As examples of another system in which color can be developed by a reaction between two components, cases in which heating is required for bringing about the reaction are known. In these cases, it is necessary to heat the system simultaneously with or just after the two-component mixing caused by rupture of microcapsules upon application of pressure.

As examples of a color former in the color former/color developer system, mention may be made of (1) triarylmethane compounds, (2) diphenylmethane compounds, (3) xanthene compounds, (4) thiazine compounds and (5) spiropyran compounds. Specific examples of these compounds include those described in U.S. Pat. No. 4,283,458 and so on. Among these compounds, color formers of (1) triarylmethane type and (3) xanthene type are favored over others, because most of these can provide low density of fog and high density of developed color. Specific examples of color formers of such types include Crystal Violet lactone, 3-diethylamino-6-chloro-7-($\beta$-ethoxyethylamino)flouran, 3-diethylamino-6-methyl-7-anilinofluoran, 3-triethylamino-6-methyl-7-anilinofluoran, 3-cyclohexylmethylamino-6-methyl-7-anilinofluoran, 3-diethylamino-7-o-chloroanilinofluoran, and so on. These compounds may be used alone or as a mixture of two or more.

As for the color developer, phenolic compounds, organic acids or metal salts thereof, oxybenzoic acid esters, acid clay and so on can be employed.

Specific examples of phenol compounds include 4,4'-iso-propylidene-diphenol (bisphenol A), p-tertbutylphenol, 2,4-dinitrophenol, 3,4-dichlorophenol, 4,4'-methylene-bis(2,6-di-tert-butylphenol), p-phenylphenol, 1,1-bis(4-hydroxyphenyl)-cyclohexane, 1,1-bis(4-hydroxyphenyl)-2-ethylhexane, 2,2-bis(4-hydroxyphenyl)butane, 2,2'-methylenebis(4-tert-butylphenol), 2,2'-methylenebis($\alpha$-phenyl-p-cresol)thiodiphenol, 4,4'-thiobis(6-tertbutyl-m-cresol), sulfonyldiphenol, p-tert-butylphenol/formaldehyde condensate, p-phenylphenol/formaldehyde condensate, and the like.

Useful examples of organic acids and their metal salts include phthalic acid, phthalic anhydride, maleic acid, benzoic acid, gallic acid, o-toluic acid, p-toluic acid, salicylic acid, 3-tert-butylsalicylic acid, 3,5di-tert-butylsalicylic acid, 5-$\alpha$-methylbenzylsali-cylic acid, 3,5-($\alpha$-methylbenzyl)salicylic acid, 3-tert-octylsalicylic acid, and zinc, lead, aluminium, magnesium and nickel salts of these acids. In particular, salicylic acid derivatives, and zinc and aluminium salts thereof are superior to other in color developability, fastness of the developed color images, storability of the recording sheets using them, and so on.

Specific examples of oxybenzoic acid esters include ethyl p-oxybenzoate, butyl p-oxybenzoate, heptyl p-oxybenzoate, benzyl p-oxybenzoate, and the like.

On the other hand, diffusion and fixation of components enclosed in microcapsules can be designed by combined use with an oil-absorbing white pigment.

In order to fuse such a color developer as described above at an intended temperature to thereby to make the color development proceed, it is desirable that the color developer should be added as an eutectic mixture with a heat-fusible substance having a low melting point, or in such a condition that a low melting compound is fused on the individual surfaces of the color developer particles and stuck thereto.

Specific examples of low melting compounds include higher fatty acid amides such as stearic acid amide, erucic acid amide, palmitic acid amide, ethylenebis-stearoamide, etc., waxes such as higher fatty acid esters, etc., phenyl benzoate derivatives, aromatic ether derivatives, and urea derivatives. However, low melting compounds other than the above-cited ones can also be used in the present invention.

As for the color formers to be used in another color former/color developer system, phenolphthalein, fluorescein, 2',4',5',7'-tetrabromo-3,4,5,6-tetrachlorofluorescein, Tetrabromophenol Blue, 4,5,6,7-tetra-bromophenolphthalein, Eosine, Aurin Cresol Red, 2-naphtholphenolphthalein and so on can be mentioned.

Color developers suitable for the combined use with the above-cited color formers are nitrogen-containing compounds, such as inorganic and organic ammonium salts, organic amines, amides, urea and thiourea and their derivatives, thiazoles, pyrroles, pyrimidines, piperazines, guanidines, indoles, imidazoles, imidazolines, triazoles, morpholines, piperidines, amidines, formazines, pyridines, and the like. Specific examples of these compounds include ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methyl-imidazole, 2-undecyl-imidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine trichloroacetate, N,N'-dibenzylpiperazine, 4,4'-dithiomorpholine, morpholinium trichloroacetate, 2-amino-benzothiazole, and 2-benzoylhydrazino-benzothiazole.

The color image-forming substance can be used in the present invention, in an amount of from about 0.5 to about 20 parts by weight, particularly preferably from about 2 to about 7 parts by weight, per 100 parts by weight of the polymerizable compound. The color developer is used in an amount of from about 0.3 to about 80 parts by weight per 1 parts by weight of the color former.

In microencapsulating the photopolymerizable composition of the present invention, methods well-known to those skilled in the art can be employed. For instance, methods of utilizing the coacervation of hydrophilic wall-forming materials, as described in U.S. Pat. Nos. 2,800,457 and 2,800,458; interfacial polymerization methods as described in U.S. Pat. No. 3,287,154, British Patent No. 990,443, JP-B-38-19574, JP-B-42-446, and JP-B-42-771; methods of utilizing the deposition of polymers as descried in U.S. Pat. Nos. 3,418,250 and 3,660,304; methods of using isocyanatepolyol wall materials as described in U.S. Pat. No. 3,796,669; methods using isocyanate wall materials as described in U.S. Pat. No. 3,914,511; methods of using the wall materials of urea-formaldehyde type or urea-formaldehyde-resorcinol type as described in U.S. Pat. Nos. 4,001,140, 4,087,376 and 4,089,802; methods of using wall forming materials such as melamine-formaldehyde resin, hydroxypropyl cellulose and the like as described in U.S. Pat. No. 4,025,455; the in situ method for polymerization of monomers as described in JP-B-36-9168 and U.S. Pat. No. 4,001,140; the electrolytic dispersing and cooling method as described in British Patent Nos. 952,807 and 965,074; and spray drying methods as described in U.S. Pat. No. 3,111,407 and British Patent No. 930,422 can be cited. Although the microencapsulation methods to be used in the present invention should not be construed as being limited to the above-cited ones, it is desirable that a polymer film as a microcapsule wall should be formed after the emulsification of a core material.

In particular, when a microcapsule wall is formed by a microencapsulation method which involves the polymerization of reactants supplied from the inside of individual oil dkroplets, great effects can be achieved. That is, capsules suitable for a recording material in respect that they have a uniform size and excellent freshness or storage stability can be obtained in a short time.

For instance, in the case of using polyurethane as a microcapsule wall material, the microcapsule wall is formed in the following manner: A polyisocyante and a second substance to react therewith (e.g., polyol, polyamine) are mixed with an oily liquid to be microencapsulated, the resulting mixture is emulsified and dispersed in water, and then the temperature of the resulting dispersion is raised to bring about the polymer forming reaction at the individual oil droplet surfaces. Therein, an auxiliary solvent having a low boiling point and strong dissolving power can be used in the oily liquid.

Polyisocyanates and their fellow reactants, e.g., polyols or polyamines, as disclosed in U.S. Pat. Nos. 3,281,383, 3,723,363, 3,773,695, 3,793,268, and 3,838,108, JP-B-48-40347, and JP-A-48-84086 can also be used in the above-described capsule wall formation.

Specific examples of polyisocyanates include diisocyanates such as m-phenylenediisocyanate, p-phenylenediisocyanate, 2,6-tolylenediisocyanate, 2,4-tolylenediisocyanate, naphthalene-1,4-diisocyanate, diphenylmethane-4,4'-diisocyanate, 3,3'-dimethoxy-4,4'-biphenyl-diisocyanate, 3,3'-dimethyldiphenylmethane-4,4'diisocyanate, xylylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate, cyclohexylene-1,4-diisocyanate and the like; triisocyanates such as 4,4',4''-triphenylmethanetriisocyanate, toluene2,4,6-triisocyanate and the like; tetraisocyanates such as 4,4'-dimethyldiphenylmethane-2,2',5,5'-tetraisocyanate; and isocyanate prepolymers such as an adduct of hexamethylenediisocyanate and trimethylolpropane, an adduct of 2,4-tolylenediisocyanate and trimethylolpropane, an adduct of xylylenediisocyanate and trimethylolpropane, an adduct of tolylenediisocyanate and hexanetriol, and so on.

As examples of polyols, mention may be made of aliphatic and aromatic polyhydric alcohols, hydroxypolyesters, hydroxypolyalkylene ethers, and so on.

In addition, polyols as described in U.S. Pat. No. 4,650,740 can also be used. Specifically, they include ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol, pentaerythritol, an adduct of pentaerythritol and ethylene oxide, an adduct of glycerin and ethylene oxide, glycerin, 1,4-di(2-hydroxyethoxy)benzene, condensation products of aromatic polyhydric alcohols and alkylene oxides (e.g., resorcinol dihydroxyethyl ether), p-xylylene glycol. m-xylylene glycol, α,α'-dihydroxy-p-diisopropylbenzene, 4,4'-dihydroxy-diphenylmethane, 2-(p,p'-dihydroxydiphenylmethyl)benzyl alcohol, an adduct of bisphenol A and ethylene oxide, an adduct of bisphenol A and propylene oxide, and so on. Such a polyol as described above is preferably used in an amount of from about 0.02 to about 2 moles, based on hydroxyl group, per 1 mole of isocyanate group.

Suitable examples of polyamines include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetertramine, diethylaminopropylamine, tetraethylenepentamine, adducts of amines and epoxy compounds, and so on.

Polyisocyanates can also form high molecular weight compounds by reaction with water.

In forming microcapsules, water-soluble macromolecules can be used. They may by any of water-soluble anionic, nonionic and amphoteric macromolecules. As for the anionic macromolecules, both natural and synthetic ones, e.g., those having $-COO^{\ominus}$, $-SO_3^{\ominus}$, etc., can be used. Specific examples of anionic natural macromolecules include gum arabic, alginic acid, pectin, etc., and those of semi-synthetics include carboxymethyl cellulose, phthaloylated gelatin, sulfated starch, sulfated cellulose, lignin sulfonic acid, etc. As examples of synthetics of anionic macromolecules, mention may be made of maleic anhydride type copolymers (including hydrolysis products), acrylic acid type homo- and co-polymers (including those of methacrylic acid type), vinylbenzenesulfonic acid type homo- and co-polymers, carboxy-denatured polyvinyl alcohol, and so on.

As examples of nonionic macromolecules, mention may be made of polyvinyl alcohol, hydroxyethyl cellulose, methyl cellulose, and so on.

As for the amphoteric macromolecules, gelatin and the like can be used.

These water-soluble macromolecules are used in the form of an about 0.01 to about 10 wt. % water solution. The size of the microcapsules is controlled to about 20 microns or less.

The size of capsules used in the present invention is about 80 microns or less, and sizes of about 20 microns or less are preferred from the standpoints of ensuring storage stability and treatment facility. On the other hand, when capsules are too small in size, it is feared that they are lost in holes or fibers of the substrate. Therefore, capsule sizes, although they cannot absolutely be stated because of dependence on the properties of the substrate or support used, are preferably about 0.1 micron or above.

It is to be desired that capsules to be used in the present invention should cause, in a substantial sense, no change under a pressure of about 10 Kg/cm² or less, and undergo rupture only when pressure greater than the foregoing value is imposed thereon. The magnitude of the pressure under which the rupture occurs can be changed depending on the intended use, so it should not be limited to particular values. However, it is preferred to rupture the capsules under a pressure of about 500 Kg/cm² or less. Such a pressure characteristic can be controlled by properly choosing the capsule size, the thickness of capsule wall, and the kinds of wall materials.

In encapsulating the polymerizable compounds and color image-forming substances to be used in the present invention, solvents can be used together Also, solvents can be used when reducing agents, color developers and so on are introduced into a desired element. For instance, a solution prepared by dissolving ingredients as described above in water or a hydrophilic organic solvent, optionally together with a binder, is coated directly on a support, or introduced into a desired element according to known methods, e.g., the method disclosed in U.S. Pat. No. 2,322,027. Incorporation of a solvent in individual microcapsules enables control of the degree of rupture of the microcapsules and amount of the color image-forming substance transferred from the inside of capsule into an image-receiving element when pressure is applied. A suitable amount of a solvent used inside the microcapsules is from about 1 to about 500 parts by weight per 100 parts by weight of the polymerizable compounds.

Solvents usable in the microcapsules of the present invention are both natural and synthetic oils. specific examples of such solvents include cotton seed oil, kerosene, aliphatic ketones, aliphatic esters, paraffin, naphthene oil, alkylated biphenyl, alkylated terphenyl, chlorinated paraffin, alkylated naphthalene, diarylethanes (such as 1-phenyl-1-xylylethane, 1-phenyl-1-p-ethylphenylethane, 1,1'-ditolylethane, etc.), phthalic acid alkyl esters (e.g., dibutyl phthalate, dioctyl phthalate), phosphoric acid esters (e.g., diphenyl phosphate, triphenyl phosphate, tricresyl phosphate, dioctylbutyl phosphate), citric acid esters (e.g., tributyl acetylcitrate), benzoic acid esters (e.g., octyl benzoate), alkylamides (e.g., diethyllaurylamide), fatty acid esters (e.g., dibutoxyethyl succinate, dioctyl acetate), trimesic acid esters (e.g., tributyl trimesate), lower alkyl acetates (such as ethyl acetate, butyl acetate, etc.), ethyl propionate, secondary butyl alcohol, methyl isobutyl ketone, β-ethoxyethylacetate, methyl cellosolve acetate, cyclohexanone, and so on.

An image-receiving element to be used together with the light-sensitive element comprising the composition of the present invention is an element for color development or fixation of the color image-forming substance released from the light-sensitive microcapsules. The light-sensitive microcapsules and the image-receiving element may be present in the same layer or separate layers provided on the same support, or in separate layers provided on different supports such as the combination of a light-sensitive sheet having the light-sensitive microcapsule-containing layer on a support with an image-receiving sheet having the image-receiving layer on another support.

In addition, the image-receiving element of the present invention may contain a mordant such as an anionic polymer or a cationic polymer, if needed. Therein, the anionic polymer and the cationic polymer may be used in combination.

In the light-sensitive and the image-receiving materials of the present invention, binders can be used alone or in combination. Representatives of hydrophilic binders are transparent or translucent ones, with specific examples including natural substances such as proteins, e.g., gelatin, gelatin derivatives, cellulose derivatives, etc., and polysaccharides, e.g., starch, gum arabic, etc.; and synthetic polymers such as water-soluble polyvinyl compounds, e.g., polyvinyl pyrrolidone, acrylamide polymers, etc. As examples of another synthetic polymer, there can be cited vinyl polymers dispersed in the latex form.

Also, addition vinyl polymers soluble in organic solvents can be used as a binder.

Supports which can be used for the light-sensitive material and the image-receiving material in the present invention are those which can withstand the processing pressure or the processing temperature. As for the general supports, not only glass, paper, wood free paper, coat paper, art paper, synthetic paper, metals and their analogues, but also an acetyl cellulose film, a cellulose ester film, a polyvinyl acetal film, a polystyrene film, a polycarbonate film, a polyethylene terephthalate film, and related films and resinous materials can be employed. In addition, paper supports laminated with polymers such as polyethylene and the like can be used. Also, polyester films described in U.S. Pat. Nos. 3,634,089 and 3,725,070 can be preferably used.

The light-sensitive material of the present invention can be provided with auxiliary layers such as a protective layer, an antistatic layer, an anticurl layer, a peel-apart layer, a matting layer, etc., if desired. In the protective layer, it is particularly desirable to incorporate an organic or inorganic matting agent for the purpose of prevention of adhesion.

Further, the light-sensitive material and the image-receiving material may contain an antifoggant, a brightening agent, a discoloration inhibitor, dyes and pigments for prevention of halation and irradiation (including white pigments such as titanium oxide), dyes for toning or coloring the materials, a thermal polymerization inhibitor, a surface active agent, a dispersed vinyl compound and so on, if needed.

Various exposure means can be employed in the present invention. In general, usually employed light sources, such as sunlight, Strobe, flash, a tungsten lamp, a mercury lamp, a halogen lamp like a iodine lamp, a xenon lamp, laser beams, a CRT light source, a plasma light source, a fluorescent tube, a light emitting diode and so on can be cited as examples. In addition, such exposure means as to combine a microshutter array with a linear or plate-form light source utilizing LCD (liquid crystal device), PLZT (lanthanum-doped lead titanozirconate), or so on can be employed.

For the purpose of enhancing the sensitivity, the layer containing the light-sensitive microcapsules of the present invention can be heated before, during and/or after the exposure.

In the present invention, images can also be developed in the exposed element by washing off the unexposed soluble part with a solvent, or thermally transferring the unexposed unhardened part into the image-receiving material, or other known methods. In the method of washing off with a solvent, not only organic solvents but also alkaline aqueous solutions can be used as a developing solvent. Examples of suitable developing solutions includes a solution of an alkali carbonate such as sodium carbonate; a solution of an alkali hydroxide such as sodium hydroxide; a mixture thereof; an aqueous solution containing a lower alcohol, such as ethanol, isopropanol, etc., and an alkanolamine such as ethanolamine, propanolamine, 2-diethylaminoethanol, etc.; and their analogues.

The presence of s surface active agent in the developing solution can further clear development of the elements. An alkali strength of the developing solution depends on the characteristics of the composition used. Also, the developing solution can contain dyes, pigments, and so on. The developed images are rinsed with distilled water, and dried. After drying, the exposed images may further be exposed, if desired.

The present invention will now be described by reference to the following specific example which is not meant to be limiting. Unless otherwise specified, all percents, ratios, etc., are by weight.

EXAMPLE 1

The following photopolymerizable compositions B-1 to B-5 were prepared using the photopolymerization initiator solutions A-1 to A-5, respectively, shown in Table 1 below.

| | |
|---|---|
| Pentaerythritol tetraacrylate | 1.0 g |
| Benzyl methacrylate/methacrylic acid (73/27 by mole) copolymer | 0.8 g |
| Acetone | 5 g |
| Methyl ethyl ketone | 10 g |
| propylene glycol monomethyl ether acetate | 5 g |
| Photopolymerization initiator solution (shown in Table 1) | See Table 1 |

TABLE 1

| Composition | A-1 | A-2 | A-3 | A-4 | A-5 |
|---|---|---|---|---|---|
| Dimethyl formamide | 5 g | 5 g | 5 g | 5 g | 5 g |
| Organic boron compound anion salt of organic cationic dye (a) | — | 0.09 g | — | — | — |
| Organic cationic dye (b) | — | — | 0.07 g | 0.07 g | — |
| Organic boron compound anion (c) | — | — | 0.05 g | — | 0.05 g |

Organic boron compound anion salt of organic cationic dye (a):

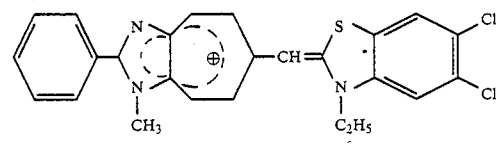

Organic cationic dye (b):

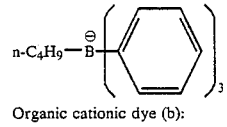

Organic boron compound (c):

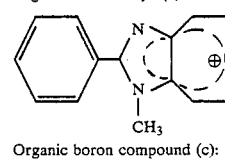

Each of the thus obtained photopolymerizable compositions B-1 to B-5 was coated on 100 μm-thick polyethylene terephthalate film in a dry thickness of 2 μm, and dried at 100° C. for 5 minutes. Further, the following overcoat layer was coated in a dry thickness of 1 μm, and dried at 100° C. for 2 minutes. Thus, light-sensitive sheets 1 to 5 were prepared.

| Coating composition for overcoat: | |
|---|---|
| Water | 98 g |
| Polyvinyl alcohol | 1.7 g |
| Hydroxypropylmethyl cellulose | 1.7 g |
| Polyvinyl pyrrolidone | 8.7 g |

Exposure was performed using an apparatus furnished with a vaccum printing frame, and each of the light-sensitive sheets 1 to 5 was exposed to a xenon lamp (made by Ushio Electric Inc.) through a stepwedge [density step difference: 0.15, density step number: 0 to 15 steps, trade name: Fuji Step Guide P (made by Fuji Photo Film Co., Ltd.)]. After exposure, the sensitive sheets were developed with the developing solution having the following formula.

| Developing solution | |
|---|---|
| Sodium carbonate (anhydrous) | 10 g |
| Butyl cellosolve | 5 g |
| Water to make | 1 liter |

The areas corresponding to the steps of low exposure wedges were eluted with the developing solution, and thereby the surface of the polyethylene terephthalate came to appear. Accordingly, the highest step number among the step wedges to which the uneluted areas corresponded was adopted as the step number of each sensitive material. Thus, a higher step number means that the sensitive material has a higher sensitivity.

The results obtained are shown in Table 2.

TABLE 2

| Light-Sensitive sheet | Polymerization Initiator solution used | Step number |
|---|---|---|
| 1 (Comparison) | A - 1 | run out |
| 2 (Invention) | A - 2 | 3rd stop |
| 3 (Invention) | A - 3 | 4th step |
| 4 (Comparison) | A - 4 | run out |
| 5 (Comparison) | A - 5 | run out |

As can be seen from the results shown in Table 2, the step number cannot be determined in the sensitive sheets prepared for comparison 1, 4 and 5 because the light-sensitive layer had not been hardened therein, resulting in the running of images.

On the other hand, the results set forth in Table 2 show that highly sensitive light-sensitive materials can be obtained by using a salt of the organic cationic dye of the present invention and an organic boron compound anion (i.e., Compound (a)), or a combination of the organic cationic dye of the present invention (Compound (b)) with an organic boron compound anion (Compound (c)).

While the invention has been described in detail and with reference to specific embodiments thereof, it will be apparent to one skilled in the art that various changes and modifications can be made therein without departing from the spirit and scope thereof.

What is claimed is:

1. A photopolymerizable composition which comprises a polymerizable compound having ethylenic unsaturated bonds, and a salt formed by an organic cationic dye compound (D⊕) and an organic boron compound anion, which is represented by the following formula (I):

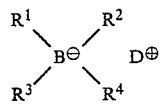     (I)

wherein D⊕ represents a cationic dye compound, and $R^1$, $R^2$, $R^3$ and $R^4$, which may be the same or different, each represents an alkyl group, an aryl group, an aralkyl group, an alkaryl group, an alkenyl group, an alkinyl group, a alicyclic group, a heterocyclic group, an allyl group, or a group having carbon atoms less than 18, selected from the derivatives of these groups, and wherein two or more of the substituent groups $R^1$ to $R^4$ may combine with each other to form a cyclic structure, said organic cationic dye compound (D⊕) being represented by the following formula (II):

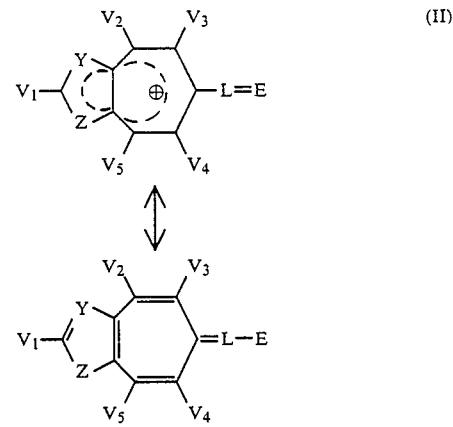

wherein E represents an auxochrome; L represents a methine group, which may be in the 4-, 5-, 6-, 7- or 8-position; $V_1$, $V_2$, $V_3$, $V_4$ and $V_5$, which may be the same or different, each represents a hydrogen atom, a halogen atom, an unsubstituted or substituted alkyl group, an acyl group, an acyloxy group, an alkoxycarbonyl group, a carbamoly group, a sulfamoyl group, a carboxy group, a cyano group, a hydroxyl group, an amino group, an acylamino group, an alkoxy group, an alkylthio group, an alkylsulfonyl group or an aryl group, and any two of $V_2$ to $V_5$ attached to two adjacent carbon atoms may combine with each other to form a condensed ring; and Y is a carbon atom represented by the formula

wherein V has the same meaning as $V_1$ to $V_5$ or a nitrogen atom represented by —N=, and Z is a chalcogen atom or a nitrogen atom represented by the formula

wherein $R_{11}$ represents a hydrogen atom, a substituted or unsubstituted alkyl group, a substituted or unsubstituted aryl group, or a heterocyclic group.

2. A photopolymerizable composition as in claim 1, wherein $R_{11}$ is selected from the group consisting of a hydrogen atom, an unsubstituted alkyl group containing not more than 18 carbon atoms, a substituted alkyl group containing not more than 18 carbon atoms, an aryl group, a substituted aryl group, and a heterocyclic group.

3. A photopolymerizable composition as in claim 1, wherein $R_{11}$ is selected from the group consisting of a hydrogen atom; an unsubstituted alkyl group containing not more than 18 carbon atoms; a substituted alkyl group containing not more than 18 carbon atoms, substituted by a cyano group, a halogen atom, a hydroxyl group, an alkoxycarbonyl group containing not more than 8 carbon atoms, an alkoxy group containing not more than 8 carbon atoms, a monocyclic aryloxy group containing not more than 10 carbon atoms, an acyloxy group containing not more than 3 carbon atoms, an acyl group containing not more than 8 carbon atoms, a carbamoyl group, s sulfamoyl group, or an aryl group containing not more than 10 carbon atoms; an aryl group; a substituted aryl group; and a heterocyclic group.

4. A photopolymerizable composition as in claim 1, wherein said dye compound represented by formula (II) is selected from the compounds represented by the following formulae (III) to (VIII):

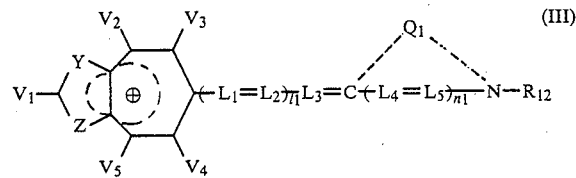

wherein $V_1$ to $V_5$, and Z have the same meanings as in claim 1, the methine bonding may be situated in any of the 4-, 5-, 6-, 7- or 8-position, $Q_1$ represents atoms necessary to complete a 5- or 6-membered nitrogen-containing hetero ring, $L_1$, $L_2$, $L_3$, $L_4$ and $L_5$, which may be the same or different, each represents a methine group which may be substituted, $R_{12}$ represents a substituted or unsubstituted alkyl group, $l_1$ represents an integer of from 0 to 3, and $n_1$ represents 0 or 1;

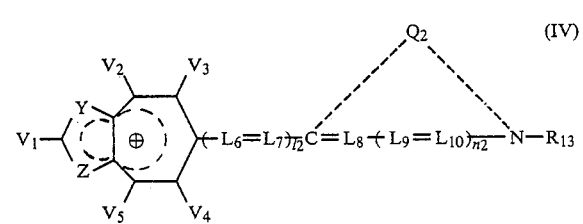

wherein $V_1$ to $V_5$, Y and Z have the same meanings as in claim 1, the methine bonding may be situated in any of the 4-, 5-, 6-, 7- or 8-position, $Q_2$ represents atoms necessary to complete a 5- or 6-membered nitrogen-containing hetero ring, $L_6$, $L_7$, $L_8$, $L_9$ and $L_{10}$ have the same meanings as $L_1$, $L_2$, $L_3$, $L_4$ and $L_5$ above, respectively, $R_{13}$ represents a substituted or unsubstituted alkyl group, $l_2$ represents an integer of from 0 to 3, and $n_2$ represents 0 or 1;

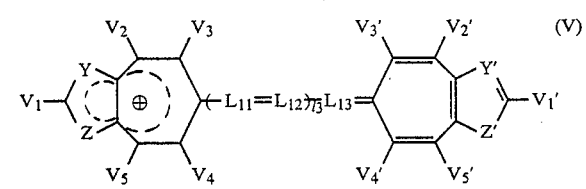

wherein $V_1$ to $V_5$, Y and Z have the same meanings as in claim 1, the position of the methine bonding may be any of the 4-, 5-, 6-, 7- or 8-position, $V_1'$ to $V_5'$ have the same meanings as $V_1$ to $V_5$ above, respectively, $L_{11}$, $L_{12}$ and $L_{13}$ each have the same meaning as $L_1$, $L_2$, $L_3$, $L_4$ or $L_5$ above, $Z'$ has the same meaning as Z above, and $l_3$ represents an integer of 0 to 3;

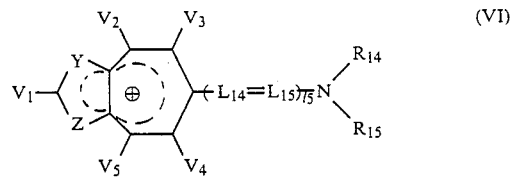

wherein $V_1$ to $V_5$, Y and Z have the same meanings as in claim 1, the position of the methine bonding may be any of the 4-, 5-, 6-, 7- or 8-position, $R_{14}$ and $R_{15}$, which may be the same or different, each represents any of substituent group known in general tertiary amines, and wherein $R_{14}$ and $R_{15}$ may combine with each other to complete a ring, $L_{14}$ and $L_{15}$ each have the same meaning as $L_1$, $L_2$, $L_3$, $L_4$ or $L_5$, and $l_5$ represents an integer of 0 to 3;

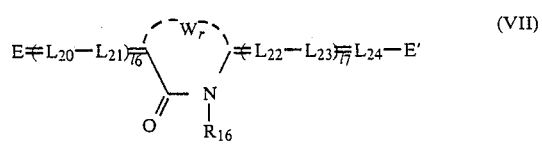

wherein E and E' are each $E_1$ or $E_2$ provided that at least either E or E' represents $E_1$:

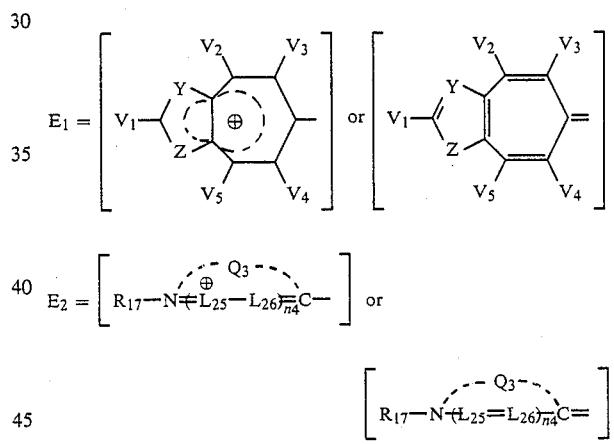

$V_1$ to $V_5$, Y and Z in $E_1$ have the same meanings as in claim 1, the position of the methine bonding in $E_1$ may be any of the 4-, 5-, 6-, 7-, or 8-position, $W_1$ represents atoms necessary to complete a 5- or 6-membered hetero ring, $R_{16}$ represents a hydrogen atom, a substituted or unsubstituted alkyl group, a substituted or unsubstituted aryl group, or a heterocyclic group, $Q_3$ and $R_{17}$ have the same meanings as $Q_1$ and $R_{12}$ above, $L_{20}$, $L_{21}$, $L_{22}$, $L_{23}$, $L_{24}$, $L_{25}$ and $L_{26}$ each have the same meaning as $L_1$, $L_2$, $L_3$, $L_4$ or $L_5$ above, $l_6$ and $l_7$, which may be the same or different, each represents an integer of 0 to 3, and $n_4$ represents 0 or 1; and

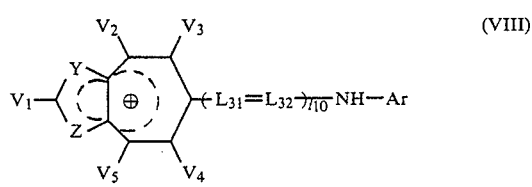

wherein $V_1$ to $V_5$, Y and Z have the same meanings as in claim 1, the position of the methine bonding may be any of the 4-, 5-, 6- or 8-position, $L_{31}$ and $L_{32}$ each have the same meaning as $L_1$, $L_2$, $L_3$, $L_4$ or $L_5$, Ar represents an aromatic group, and $l_{10}$ represents an integer of from 0 to 3.

5. A photopolymerizable composition as in claim 4, wherein $V_1$, $V_2$, $V_3$, $V_4$, $V_5$, $V_1'$, $V_2'$, $V_3'$, $V_4'$ and $V_5'$ are each selected from the group consisting of a hydrogen atom, a halogen atom, an unsubstituted alkyl group containing not more than 10 carbon atoms, a substituted alkyl group containing not more than 18 carbon atoms, an acyl group containing not more than 10 carbon atoms, an acyloxy group containing not more than 10 carbon atoms, an alkoxycarbonyl group containing not more than 10 carbon atoms, a substituted or unsubstituted carbamoyl group, a substituted or unsubstituted sulfamoyl group, a carboxyl group, a cyano group, a hydroxyl group, an amino group, an acylamino group containing not more than 8 carbon atoms, an alkoxy group containing not more than 10 carbon atoms, an alkylthio group, an alkylsulfonyl group, and an aryl group, provided that any two of $V_2$ to $V_5$ attached to two adjacent carbon atoms may combine with each other to form a benzene ring or a hetero ring.

6. A photopolymerizable composition as in claim 4, wherein $Q_1$ and $Q_3$ complete a nucleus selected from the group consisting of thiazole nuclei, benzothiazole nuclei, naphthothiazole nuclei, thiazoline nuclei, oxazole nuclei, oxazoline nuclei, selenazole nuclei, selenazoline nuclei, tellurazole nuclei, tellurazoline nuclei, 3,3-dialkylindolenine nuclei, imidazole nuclei, pyridine nuclei, quinoline nuclei, imidazo[4,5-b]quinoxaline nuclei, oxadiazole nuclei, thiadiazole nuclei, tetrazole nuclei, and pyrimidine nuclei.

7. A photopolymerizable composition as in claim 4, wherein $R_{12}$, $R_{13}$, and $R_{17}$ are each selected from the group consisting of an unsubstituted alkyl group containing not more than 18 carbon atoms, and a substituted alkyl group substituted by a cyano group, a halogen atom, a hydroxyl group, an alkoxycarbonyl group containing not more than 8 carbon atoms, an alkoxy group containing not more than 8 carbon atoms, a monocyclic aryloxy group containing not more than 10 carbon atoms, an acyloxy group containing not more than 3 carbon atoms, an acyl group containing not more than 8 carbon atoms, a carbamoyl group, a sulfamoyl group, and an aryl group containing not more than 10 carbon atoms.

8. A photopolymerizable composition as in claim 4, wherein $R_{14}$ and $R_{15}$ may be the same or different, and each represents an unsubstituted alkyl group containing not more than 18 carbon atoms; a substituted alkyl group substituted by a cyano group, a halogen atom, a hydroxyl group, an alkoxycarbonyl group containing not more than 8 carbon atoms, an alkoxy group containing not more than 8 carbon atoms, a monocyclic aryl group containing not more than 10 carbon atoms, an acyloxy group containing not more than 3 carbon atoms, an acyl group containing not more than 8 carbon atoms, a carbamoyl group, a sulfamoyl group, and an aryl group containing not more than 10 carbon atoms; a cyano group, an alkoxy group, an aryloxy group, or an alkoxycarbonyl group.

9. A photopolymerizable composition as in claim 4, wherein the heterocyclic nucleus completed by $Q_2$ is selected from the group consisting of a pyrrole nucleus, a carbazole nucleus, an indole nucleus, a pyrazole ncleus, a pyrazolo[1,5-a]benzimidazole nucleus, a pyrazolo[1,5-b]quinazolone nucleus and an indazole nucleus.

10. A photopolymerizable composition as in claim 4, wherein $R_{16}$ is selected from the group consisting of a hydrogen atom, an alkyl group containing 1 to 18 carbon atoms, a substituted alkyl group, an allyl group, an aryl group, a substituted aryl group, and a heterocyclic group.

11. A photopolymerizable composition as in claim 1, wherein said salt formed by an organic boron compound anion and an organic cationic dye compound is present in an amount of from 0.01 to 50 wt. % based on the weight of the polymerizable compound.

12. A photopolymerizable composition as in claim 1, wherein said polymerizable compound having ethylenic unsaturated bonds is encapsulated into microcapsules.

13. A photopolymerizable composition as in claim 12, wherein said microcapsules containing said polymerizable compound having ethylenic unsaturated bonds further contain said salt formed by an organic boron compound anion and an organic cationic dye compound.

* * * * *